United States Patent
Lo et al.

(10) Patent No.: US 10,274,801 B2
(45) Date of Patent: Apr. 30, 2019

(54) DISPLAY PANEL

(71) Applicant: AU Optronics Corporation, Hsin-Chu (TW)

(72) Inventors: Yen-Hua Lo, Hsin-Chu (TW); Szu-Yen Lin, Hsin-Chu (TW); Hsin-Chun Huang, Hsin-Chu (TW); Ching-Sheng Cheng, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/928,406

(22) Filed: Mar. 22, 2018

(65) Prior Publication Data

US 2018/0275473 A1     Sep. 27, 2018

(30) Foreign Application Priority Data

Mar. 27, 2017   (TW) .............................. 106110199 A

(51) Int. Cl.
*H01L 33/62*   (2010.01)
*H01L 27/12*   (2006.01)
(Continued)

(52) U.S. Cl.
CPC ...... *G02F 1/136286* (2013.01); *G02F 1/1368* (2013.01); *H01L 27/124* (2013.01);
(Continued)

(58) Field of Classification Search
CPC ............. H01L 27/124; G02F 1/134309; G02F 2001/134318
(Continued)

(56) References Cited

U.S. PATENT DOCUMENTS

2006/0097971 A1* 5/2006 Lee .................... G09G 3/3648
                                                      345/89
2008/0002079 A1* 1/2008 Kimura ............... G02B 6/0051
                                                      349/42
(Continued)

FOREIGN PATENT DOCUMENTS

CN       202159214 U    3/2012
TW       201025274 A    7/2010

OTHER PUBLICATIONS

Taiwan Intellectual Property Office, "Office Action", dated Aug. 28, 2017.

*Primary Examiner* — George R Fourson, III
(74) *Attorney, Agent, or Firm* — WPAT, PC

(57) ABSTRACT

A display panel includes a substrate, a plurality of first signal lines, a plurality of second signal lines, a plurality of sub-pixel electrodes, and a first common electrode layer. The plurality of first signal lines and the plurality of second signal lines define a plurality of pixel areas together. Each of the plurality of sub-pixel electrodes is disposed in one of the plurality of pixel areas. The first common electrode layer includes a plurality of first common electrodes electrically connected to each other. Each first common electrode includes a stem and a plurality of branches, and the plurality of branches is coupled to two sides of the stem and extends away from the stem. An orthogonal projection of each stem onto the substrate is located between two adjacent sub-pixel electrodes. Orthogonal projections of the branches onto the substrate at least correspond to one sub-pixel electrode.

14 Claims, 14 Drawing Sheets

(51) Int. Cl.
  *G02F 1/1362* (2006.01)
  *G02F 1/1368* (2006.01)
  G02F 1/1335 (2006.01)
  G02F 1/1343 (2006.01)

(52) U.S. Cl.
  CPC .. *G02F 1/133512* (2013.01); *G02F 1/133514* (2013.01); *G02F 1/134309* (2013.01); *G02F 2001/13685* (2013.01); *G02F 2001/134318* (2013.01); *G02F 2001/134345* (2013.01); *G02F 2201/121* (2013.01); *G02F 2201/122* (2013.01); *G02F 2201/123* (2013.01); *G02F 2201/52* (2013.01)

(58) Field of Classification Search
  USPC .......................................................... 257/79
  See application file for complete search history.

(56) References Cited

U.S. PATENT DOCUMENTS

| | | | | |
|---|---|---|---|---|
| 2009/0244425 A1* | 10/2009 | Jung | G02F 1/133753 | 349/48 |
| 2010/0110358 A1* | 5/2010 | Um | G02F 1/134363 | 349/141 |
| 2010/0127961 A1* | 5/2010 | Huh | G02F 1/136227 | 345/92 |
| 2010/0128189 A1 | 5/2010 | Teranishi et al. | | |
| 2010/0195034 A1* | 8/2010 | Lee | G02F 1/133753 | 349/124 |
| 2010/0328591 A1* | 12/2010 | Oh | G02F 1/133555 | 349/114 |
| 2012/0057118 A1* | 3/2012 | Morishita | G02F 1/134363 | 349/141 |
| 2012/0200818 A1* | 8/2012 | Lee | G02F 1/1362 | 349/143 |
| 2012/0262653 A1* | 10/2012 | Shimizu | G02F 1/133707 | 349/106 |
| 2012/0320320 A1* | 12/2012 | Chen | G02F 1/133707 | 349/106 |
| 2013/0148068 A1* | 6/2013 | Maeda | G02F 1/134309 | 349/138 |
| 2013/0201434 A1* | 8/2013 | Murata | G02F 1/134363 | 349/141 |
| 2013/0300968 A1* | 11/2013 | Okajima | G02F 1/136209 | 349/43 |
| 2014/0015739 A1* | 1/2014 | Tsao | G09G 3/3648 | 345/87 |
| 2014/0092353 A1* | 4/2014 | Matsushima | G02F 1/133512 | 349/110 |
| 2014/0132907 A1* | 5/2014 | Qin | G02F 1/134363 | 349/143 |
| 2015/0177571 A1* | 6/2015 | Yoshida | G02F 1/134363 | 349/33 |
| 2015/0198851 A1* | 7/2015 | Park | G02F 1/134309 | 349/46 |
| 2016/0018693 A1* | 1/2016 | Um | G09G 3/3655 | 345/58 |
| 2016/0187739 A1* | 6/2016 | Iwata | G02F 1/134363 | 349/42 |
| 2016/0238906 A1 | 8/2016 | Wu et al. | | |
| 2017/0017127 A1* | 1/2017 | Gan | G02F 1/133514 | |
| 2017/0307947 A1* | 10/2017 | Feng | G02F 1/1362 | |
| 2017/0336681 A1* | 11/2017 | Jia | G02F 1/134309 | |
| 2018/0188625 A1* | 7/2018 | Tian | G02F 1/134363 | |
| 2018/0342540 A1* | 11/2018 | Ying | H01L 27/1255 | |

* cited by examiner

DISPLAY PANEL

BACKGROUND

Technical Field

The present invention relates to display technologies, and in particular, to a display panel.

Related Art

The evolution of semiconductor and photoelectricity technologies has resulted in development of displays. Among various displays, liquid crystal display panels are particularly widely used because of the advantages of low power consumption, thin thickness, light weight, high color saturation, and long life time, and therefore become one of the main streams of modern displays. Therefore, in recent years, various important parameters used for evaluating the quality of liquid crystal display panels, such as the response time, viewing angle, brightness, and contrast, are constantly improved.

In a conventional architecture of a liquid crystal display panel, requirements for a wide viewing angle and a short response time are usually achieved by sacrificing the liquid crystal efficiency (LC %). However, the liquid crystal efficiency is still one of the important parameters for evaluating the quality of liquid crystal display panels. Therefore, how to widen the viewing angle and shorten the response time of the liquid crystal display panel without unduly sacrificing the liquid crystal efficiency is an important subject.

SUMMARY

In view of this, in an embodiment, a display panel includes a substrate, a plurality of first signal lines, a plurality of second signal lines, a plurality of sub-pixel electrodes, and a first common electrode layer. The plurality of first signal lines is disposed on the substrate and extends along a first direction. The plurality of second signal lines is disposed on the substrate and extends along a second direction. The second direction is orthogonal to the first direction. The plurality of first signal lines and the plurality of second signal lines define a plurality of pixel areas together. Each of the plurality of sub-pixel electrodes is disposed in one of the plurality of pixel areas. The first common electrode layer includes a plurality of first common electrodes electrically connected to each other. Each first common electrode includes a stem and a plurality of branches. The plurality of branches is coupled to two sides of the stem and extends away from the stem. A first orthogonal projection of the stem onto the substrate is located between two adjacent sub-pixel electrodes. Second orthogonal projections of the branches onto the substrate at least correspond to one sub-pixel electrode.

The detailed features and advantages of the present invention are described below in great detail through the following embodiments, and the content of the detailed description is sufficient for persons skilled in the art to understand the technical content of the present invention and to implement the present invention there accordingly. Based upon the content of the specification, the claims, and the drawings, persons skilled in the art can easily understand the relevant objectives and advantages of the present invention.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1:
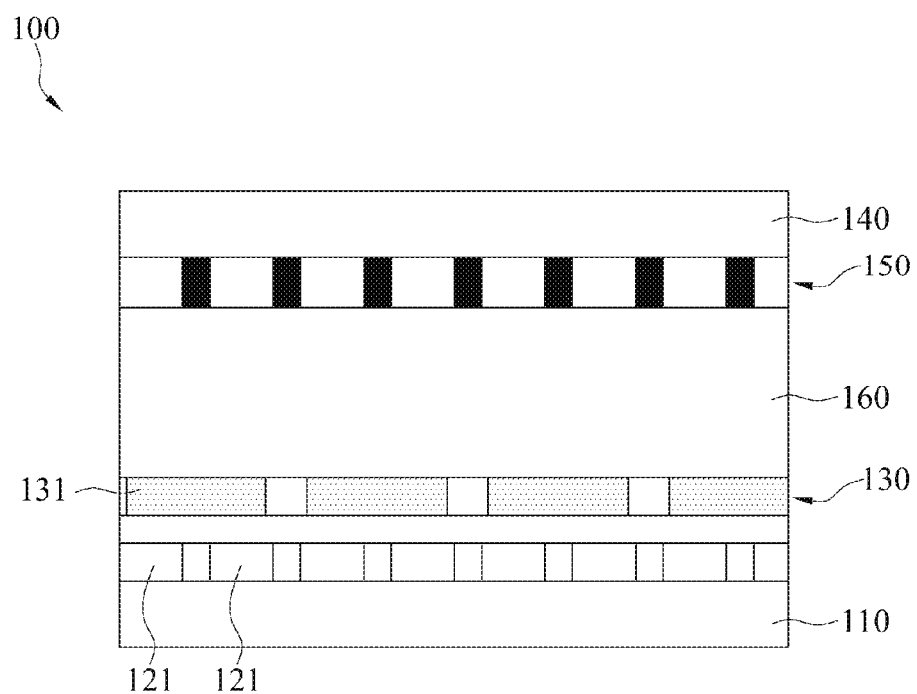
FIG. 1 is a schematic structural side view of a first embodiment of a display panel.
Figure 2:
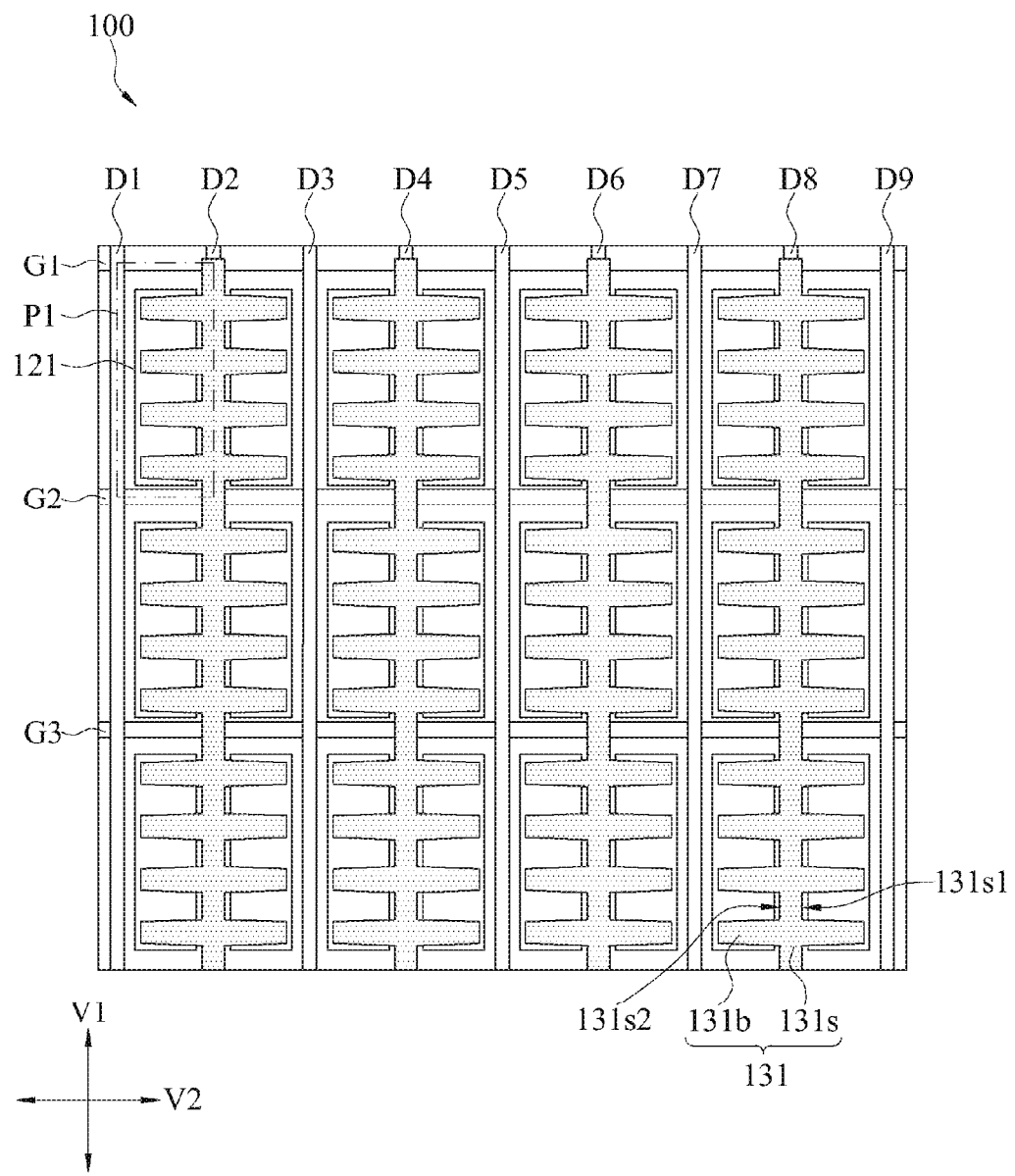
FIG. 2 is a schematic top view of the first embodiment of the display panel.

FIG. 1 is a schematic structural side view of a first embodiment of a display panel. FIG. 2 is a schematic top view of the first embodiment of the display panel. Referring to FIG. 1 and FIG. 2, the display panel 100 includes a substrate 110, a plurality of first signal lines D1-D9, a plurality of second signal lines G1-G3, a plurality of sub-pixel electrodes 121, and a first common electrode layer 130.

The first signal lines D1-D9 extend along a first direction V1, and are disposed on the substrate 110 spaced apart from each other. The second signal lines G1-G3 extend along a second direction V2, and are disposed on the substrate 110 spaced apart from each other. The second signal lines G1-G3 intersect with the first signal lines D1-D9. The first signal lines D1-D9 and the second signal lines G1-G3 define a plurality of pixel areas P1 together. Each of the sub-pixel electrodes 121 is disposed in one of the pixel areas P1. The first common electrode layer 130 is located above the plurality of sub-pixel electrodes 121. A dielectric layer (not shown in the figure) exists between the first common electrode layer 130 and the plurality of sub-pixel electrodes 121. However, the present invention is not limited thereto. Alternatively, the first common electrode layer 130 may be located under the plurality of sub-pixel electrodes 121. In an embodiment, the first direction V1 is orthogonal to the second direction V2, and the pixel areas P1 are approximately rectangular.

The first common electrode layer 130 includes a plurality of first common electrodes 131. The first common electrodes 131 are coupled to each other and are electrically connected to a same potential. Each first common electrode 131 includes a stem 131s and a plurality of branches 131b. The branches 131b are coupled to two sides of the stem 131s and extend away from the stem 131s. That is, each stem 131s extends along the first direction V1, and each branch 131b extends along the second direction V2, as shown in FIG. 2.

In an embodiment, the branches 131b of each first common electrode 131 are spaced apart from branches 131b of an adjacent first common electrode 131 in the second direction V2. In other words, each first common electrode 131 is not directly coupled to each adjacent first common electrode 131 in the second direction V2, instead, is coupled to an adjacent first common electrode 131 in the first direction V1. In other words, the first common electrodes 131 in a same row are not directly coupled to each other in the second direction V2.

In an embodiment, the stem 131s of each first common electrode 131 extends along the first direction V1, and the branches 131b of each first common electrode 131 extend along the second direction V2. In addition, in any first common electrode 131, the branches 131b are coupled to two opposite sides (a first side 131s1 and a second side 131s2), extending along the long axis of the stem 131s, that is, some branches 131b are coupled to the first side 131s1 of the stem 131s, and other branches 131b are coupled to the second side 131s2 of the stem 131s. In addition, the plurality of branches 131b may be evenly disposed on the two opposite sides of the stem 131s.

For example, as shown in FIG. 2, when each first common electrode 131 has a total of eight branches 131b, in each first common electrode 131, the branches 131b may be evenly divided into two groups. One group of branches 131b are coupled to the left side 131s2 of the stem 131s, and the other group of branches 131b are coupled to the right side 131s1 of the stem 131s. In other words, in this case, each of the two opposite sides of the stem 131s is coupled to four branches 131b, and symmetric configuration may be performed. However, the quantity of each group of branches 131b and the configuration form are not limited thereto. When the quantity of branches 131b is an odd number, for example, when there are a total of seven branches 131b, in this case, one side of the stem 131s may be coupled to four branches 131b, the other side is coupled to three branches 131b, and configuration may be performed in a staggered manner.

In an embodiment, an orthogonal projection of the stem 131s of each first common electrode 131 onto the substrate 110 is located between two adjacent sub-pixel electrodes 121. In other words, the stem 131s of each first common electrode 131 corresponds to positions of the first signal lines D1-D9 and is disposed on one first signal line. In addition, orthogonal projections of the branches 131b of each first common electrode 131 onto the substrate 110 may correspond to at least one sub-pixel electrode 121.

In an embodiment, as shown in FIG. 2, each first common electrode 131 corresponds to two sub-pixel electrodes 121, that is, on the orthogonal projection onto the substrate 110, a layout of each first common electrode 131 includes corresponding two sub-pixel electrodes: a left sub-pixel electrode 121 and a right sub-pixel electrode 121. Moreover, the extension length of the branches 131b of each first common electrode 131 is approximately less than the width of one pixel area P1, that is, on the orthogonal projection onto the substrate 110, the branches 131b on each side of the stem 131s correspond to one pixel area P1. In other words, in this case, every two sub-pixel electrodes 121 share one first common electrode 131. However, the present invention is not limited thereto.

In an embodiment, on the orthogonal projection onto the substrate 110, the stem 131s of each first common electrode 131 and a stem 131s of an adjacent first common electrode 131 in the second direction V2 are spaced apart by at least two sub-pixel electrodes 121. For example, on the orthogonal projection onto the substrate 110, a central line of the stem 131s of each first common electrode 131 may approximately overlap with an edge of the pixel area P1. A distance between the central line of the stem 131s of each first common electrode 131 and a central line of a stem 131s of an adjacent first common electrode 131 in the second direction V2 is approximately equal to the width of two pixel areas P1, as shown in FIG. 2. In other words, a first common electrode 131 may be disposed at a same relative position (for example, on the first signal line) in the second direction V2 on the display panel 100 at an interval of every two pixel areas P1 or two sub-pixel electrodes 121. However, the present invention is not limited thereto.

Figure 3:
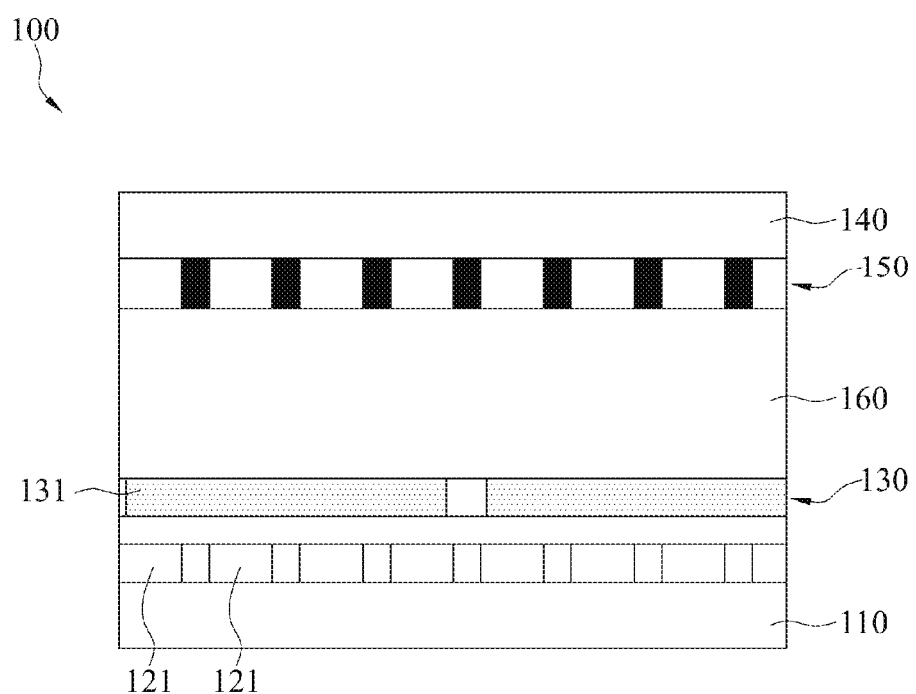
FIG. 3 is a schematic structural side view of a second embodiment of a display panel.
Figure 4:
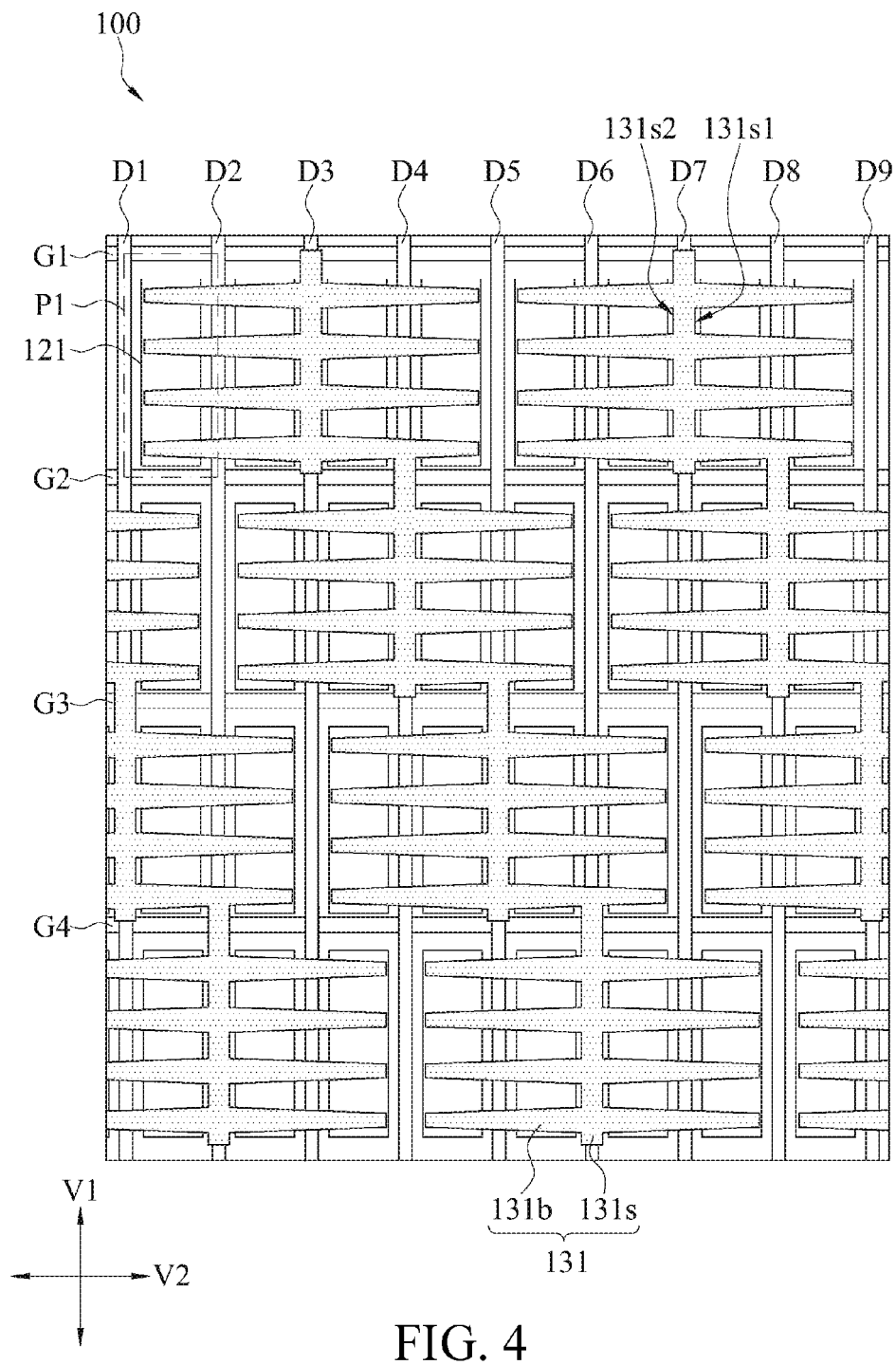
FIG. 4 is a schematic top view of the second embodiment of the display panel.
Figure 5:
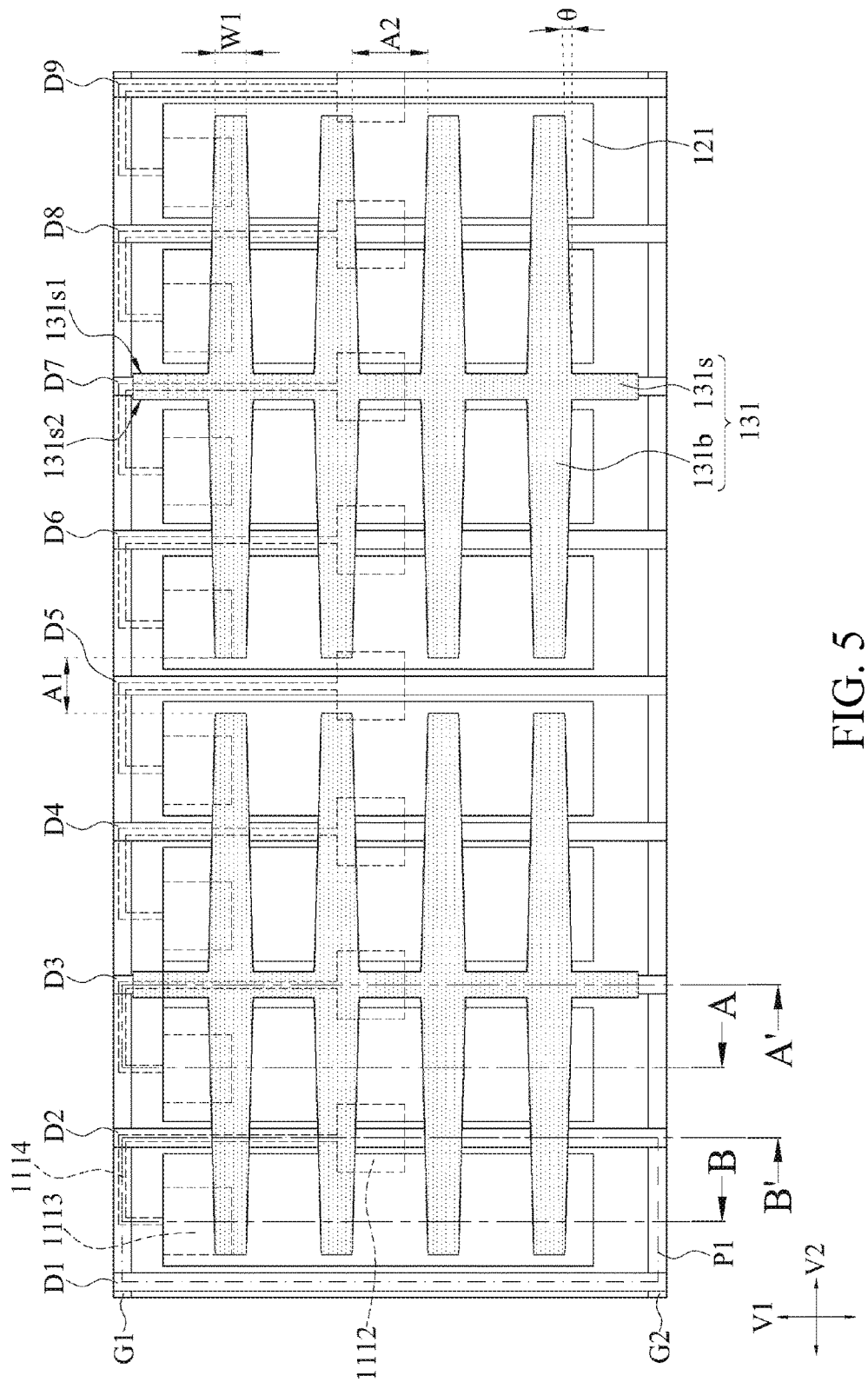
FIG. 5 is a schematic diagram of a first implementation aspect of a first common electrode and a sub-pixel electrode.

FIG. 3 is a schematic structural side view of a second embodiment of a display panel. FIG. 4 is a schematic outline top view of the second embodiment of the display panel. FIG. 5 is a schematic outline diagram of a first implementation aspect of a first common electrode and a sub-pixel electrode. Referring to FIG. 3 to FIG. 5, in another embodiment, each first common electrode 131 corresponds to four sub-pixel electrodes 121. In other words, each first common electrode 131 covers four sub-pixel electrodes 121. The extension length of branches 131b is approximately greater than the width of one pixel area P1 and is slightly less than the width of two pixel areas P1 (in other words, the extension lengths of the branches 131b are between a width of one pixel area and a width of two pixel areas), so that orthogonal projections of the branches 131b onto a substrate 110 may correspond to two sub-pixel electrodes 121. In other words, in this case, an orthogonal projection of each first common electrode 131 onto the substrate 110 may approximately correspond to four sub-pixel electrodes 121, that is, every four sub-pixel electrodes 121 share one first common electrode 131. Referring to FIG. 4, in an embodiment, stems 131s of first common electrodes 131 arranged and connected to each other in a first direction V1 do not correspond to a same first signal line, instead, are disposed by sequentially performing displacement for one pixel area in a second direction V2. For example, a stem 131s of the first one of the first common electrodes 131 is disposed corresponding to a first signal line D3; a stem 131s of a subsequent connected first common electrode 131 may be disposed corresponding to a first signal line D4; a stem 131s of a next connected first common electrode 131 may be disposed corresponding to a first signal line D5; and a stem 131s of a further next connected first common electrode 131 may be disposed corresponding to a first signal line D6, and so on.

In an embodiment, when the orthogonal projection of each first common electrode 131 onto the substrate 110 may at least correspond to four sub-pixel electrodes 121, the four corresponding sub-pixel electrodes 121, for example, are disposed adjacent to each other along the second direction V2. Sub-pixels corresponding to at least three sub-pixel electrodes 121 may be used to display different colors, for example, red, green, and blue. However, colors that may be displayed are not limited thereto.

Figure 6:
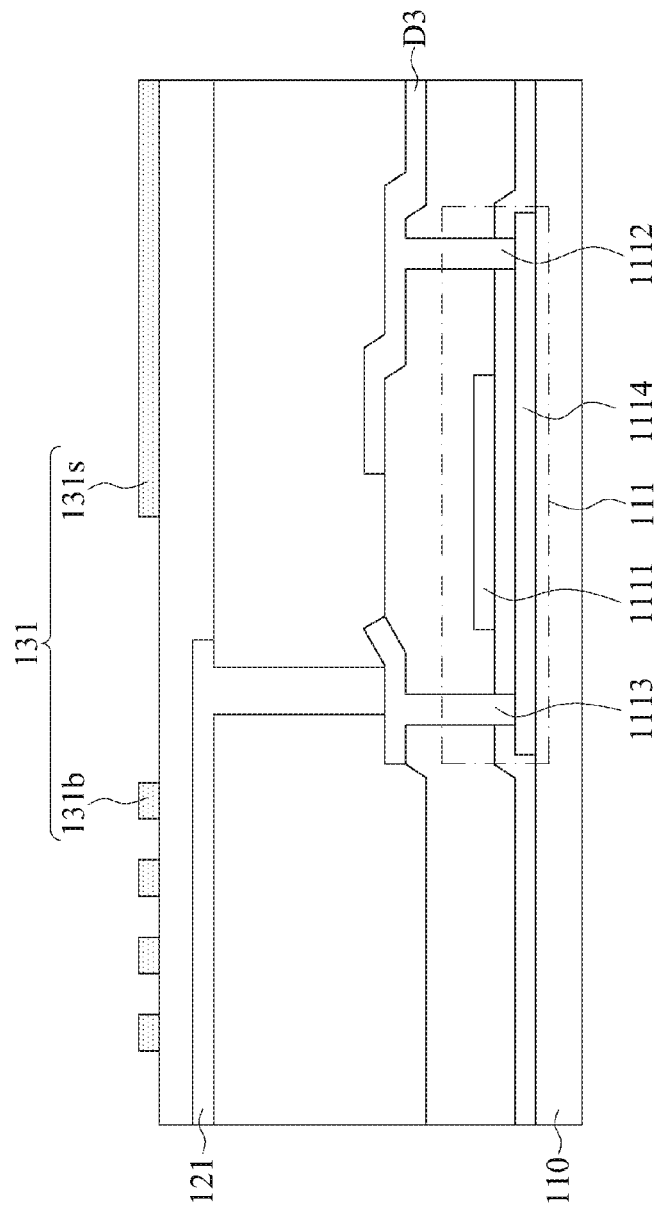
FIG. 6 is a schematic structural cross-sectional view along a section line A-A' in FIG. 5.
Figure 7:
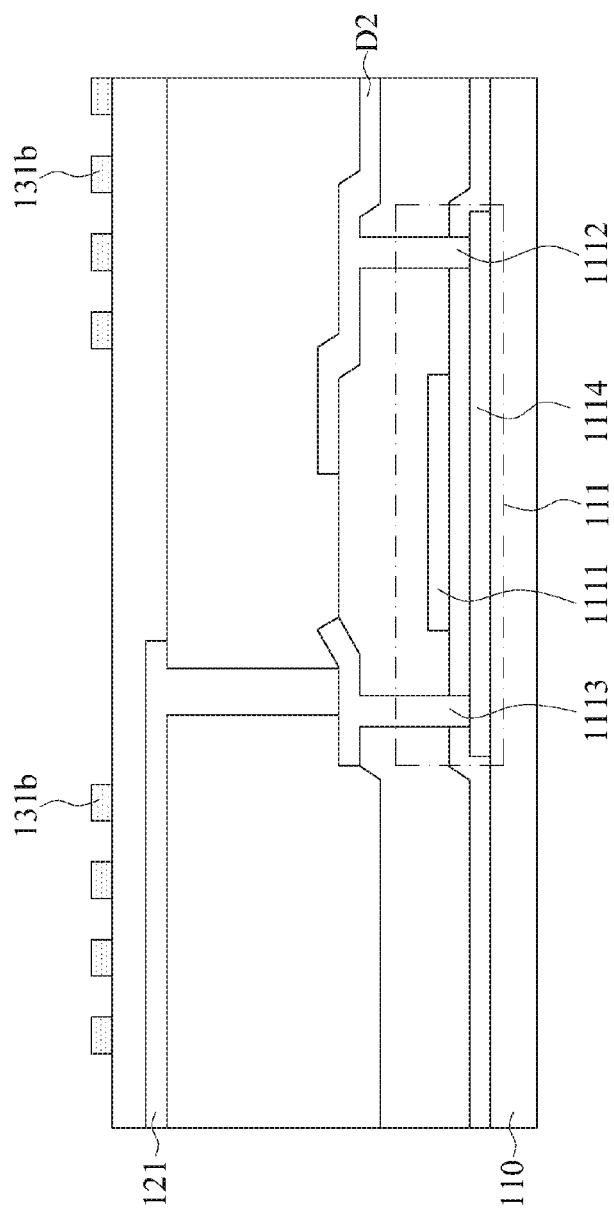
FIG. 7 is a schematic structural cross-sectional view along a section line B-B' in FIG. 5.

FIG. 6 is a schematic structural cross-sectional view along a section line A-A' in FIG. 5. FIG. 7 is a schematic structural cross-sectional view along a section line B-B' in FIG. 5. Referring to FIG. 4 to FIG. 7, in some embodiments, the substrate 110 may be an active element array substrate provided with a plurality of active elements 111. The active elements 111 are arranged in a form of an array. Each active element 111 may be coupled to one of first signal lines D1-D9, one of second signal lines G1-G3, and one of sub-pixel electrodes 121. The first signal lines D1-D9 may be configured to transmit data signals. The second signal lines G1-G3 may be configured to transmit scanning signals. However, the present invention is not limited thereto.

The active element 111 includes a gate 1111, a source 1112, a drain 1113, and a channel layer 1114. In an embodiment, the active element 111 may be implemented by a top gate thin-film transistor or a bottom gate thin-film transistor. Herein, the drawn active element 111 is a top gate thin-film transistor. The gate 1111 is located on the channel layer 1114 and is insulated from the channel layer 1114. The channel layer 1114 is located between the source 1112 and the drain 1113, and conducts the source 1112 to the drain 1113 when the gate 1111 receives a proper voltage. As shown in FIG. 5, approximate positions of the source 1112, the drain 1113, and the channel layer 1114 of the active element 111 are shown by using dashed lines. In an embodiment, the gate 1111 may be coupled to one of the second signal lines G1-G3, the source 1112 may be coupled to one of the first signal lines D1-D9, and the drain 1113 may be coupled to one of the sub-pixel electrodes 121.

In an embodiment, the branches 131b of each first common electrode 131 are spaced apart from branches 131b of an adjacent first common electrode 131 by a first spacing A1 in the second direction V2. In some embodiments, the first spacing A1 approximately does not exceed the width of one pixel area P1 or one sub-pixel electrode 121. In other words, the first spacing A1 is approximately less than or equal to the width of one pixel area P1 or one sub-pixel electrode 121. The width of the sub-pixel electrode 121 is approximately less than or equal to the width of the pixel area P1.

In an embodiment, the extension lengths of the branches of each first common electrode 131 may be approximately the same. However, the present invention is not limited thereto. The extension lengths of the branches of each first common electrode 131 may not be the same.

In another embodiment, on the orthogonal projection onto the substrate 110, a first common electrode 131 may be disposed at a same relative position in the second direction V2 on the display panel 100 at an interval of every four pixel areas P1 or four sub-pixel electrodes 121, so that a distance between a central line of each stem 131s and a central line of an adjacent stem 131s in the second direction V2 is approximately equal to the width of four pixel areas P1, as shown in FIG. 4 or FIG. 5.

Figure 8:
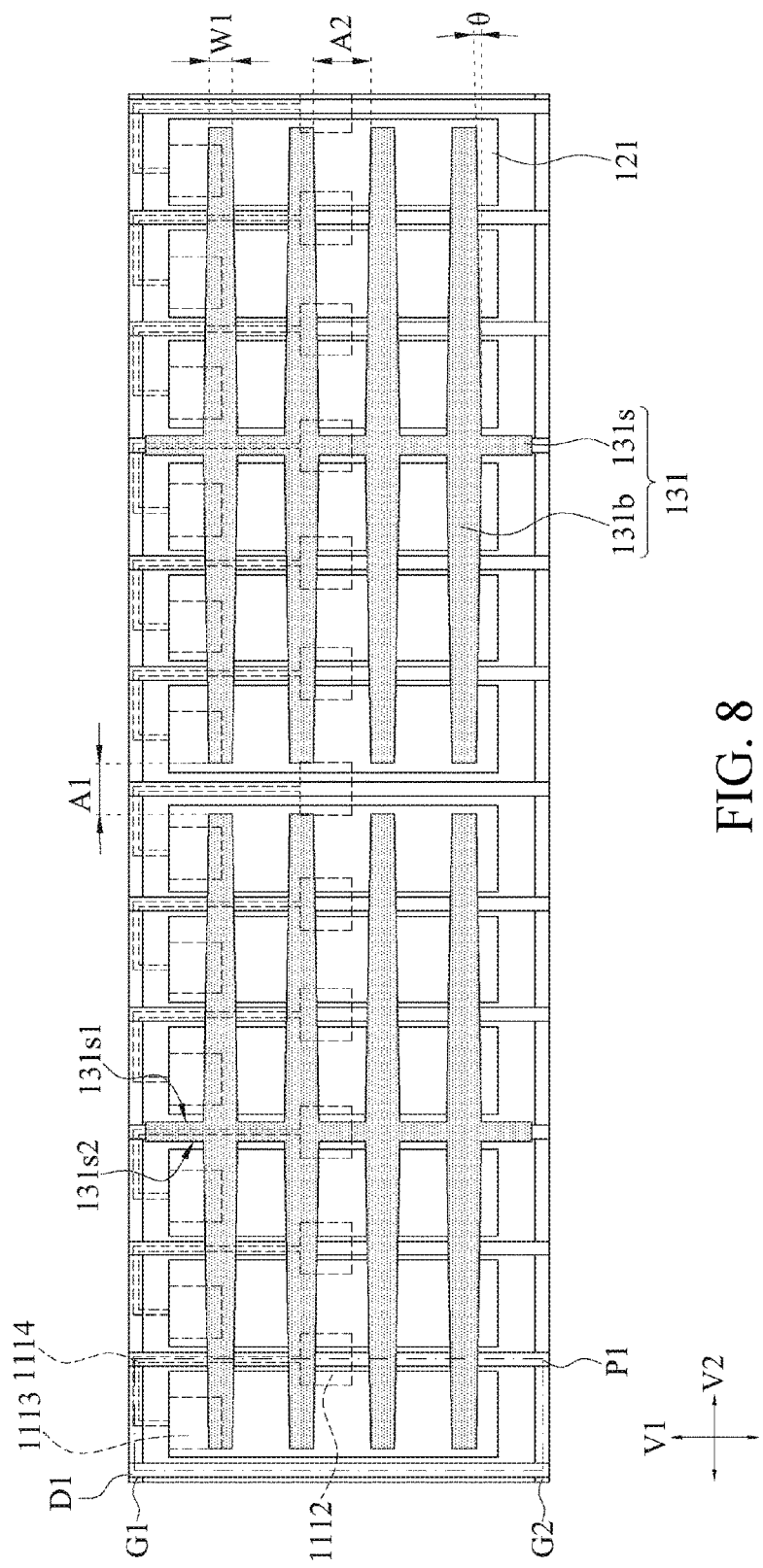
FIG. 8 is a schematic diagram of a second implementation aspect of a first common electrode and a sub-pixel electrode.

FIG. 8 is a schematic outline diagram of a second implementation aspect of a first common electrode and a sub-pixel electrode. In still another embodiment, on the orthogonal projection onto the substrate 110, a first common electrode 131 may further be disposed at a same relative position in the second direction V2 on the display panel 100 at an interval of every six pixel areas P1 or six sub-pixel electrodes 121, so that a distance between a central line of each stem 131s and a central line of an adjacent stem 131s in the second direction V2 is approximately equal to the width of six pixel areas P1, as shown in FIG. 8.

Referring to FIG. 5 or FIG. 8, in some embodiments, in any first common electrode 131, the branches 131b may be spaced apart from each other in the first direction V1 by a second spacing A2. Herein, the second spacing A2 is an absolute distance between ends of two adjacent branches 131b (that is, ends of the branches 131b away from the stem 131s). In some embodiments, the second spacing A2 may range from 2.5 μm to 8 μm. However, the present invention is not limited thereto. The second spacing A2 may be changed according to requirements such as the length of the pixel area P1, the response time needed by the display panel 100, and the liquid crystal efficiency (LC %).

In an embodiment, each branch 131b of the first common electrode 131 is approximately rectangular, that is, each branch 131b at least has two opposite sides extending along the second direction V2. In other words, the width W1 (that is, an absolute distance between two opposite sides parallel to the second direction V2) of each branch 131b may be a constant value, that is, two opposite sides of each branch 131b are approximately parallel. However, the present invention is not limited thereto. In another embodiment, the width W1 of each branch 131b may not be a constant value, that is, two opposite sides of each branch 131b are not parallel.

For example, in an embodiment, the width W1 of each branch 131b of each first common electrode 131 may gradually decrease from one end coupled to the stem 131s to the other end (that is, away from the stem 131s), as shown in FIG. 2, FIG. 4, FIG. 5, and FIG. 8. In other words, the width W1 of each branch 131b of each first common electrode 131 may gradually decrease from a first end coupled to the stem 131s to a second end (that is, away from the stem 131s).

Figure 9:
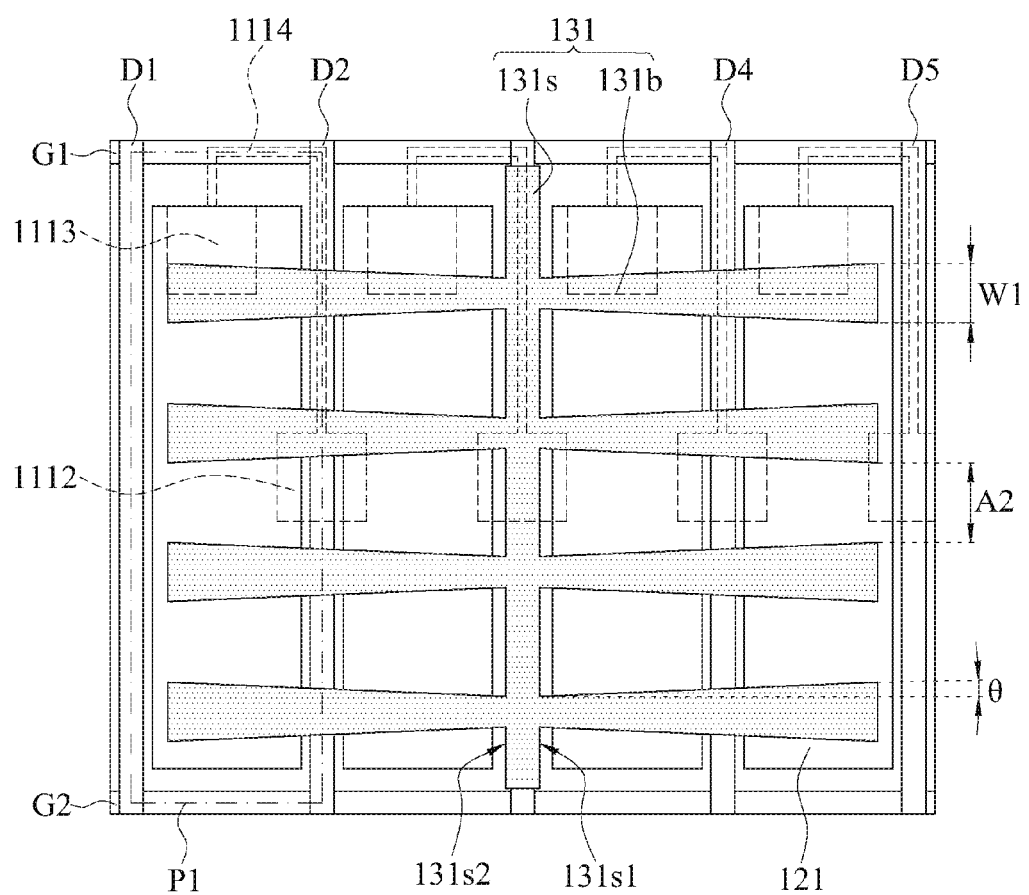
FIG. 9 is a schematic diagram of a third implementation aspect of a first common electrode and a sub-pixel electrode.

FIG. 9 is a schematic outline diagram of a third implementation aspect of a first common electrode and a sub-pixel electrode. In another embodiment, the width W1 of each branch 131b of each first common electrode 131 may gradually increase from one end coupled to the stem 131s (that is, approaching the stem 131s) to the other end, as shown in FIG. 9. In other words, the width W1 of each branch 131b of each first common electrode 131 may gradually increase from a first end coupled to the stem 131s (that is, approaching the stem 131s) to a second end.

In an embodiment, an angle θ may be formed between an edge (any side) of each branch 131b of each first common electrode 131 in the second direction V2 and a line perpendicular to an edge (that is, a first side 131s1 or a second side 131s2) of the stem 131s, to adjust the response time and the liquid crystal efficiency of the display panel 100. That is, the display panel 100 may have the needed response time and liquid crystal efficiency by properly selecting the size of the angle θ. In an embodiment, the angle θ may range from 0 degrees to 45 degrees. In other words, an edge of each branch and the stem are angled from 45 degrees to 90 degrees.

In some embodiments, the width W1 of each branch 131b of the first common electrode 131 may range from 0.5 μm to 2.5 μm. However, the present invention is not limited thereto. Herein, the width W1 of each branch 131b of the first common electrode 131 may be changed according to the length of the pixel area P1, the quantity of sub-pixel electrodes 121 corresponding to the first common electrode 131, the angle θ, and the like.

In an embodiment, the first common electrodes 131 may be connected to each other by means of extension of the stems 131s and one of a plurality of branches 131b of another adjacent common electrode 131 in the first direction V1, as shown in FIG. 4. However, the present invention is not limited thereto. In another embodiment, the first common electrodes 131 may further be connected to each other by using a connection electrode 131c connected to one of the plurality of branches 131b and one of a plurality of branches 131b of another first common electrode 131, as shown in FIG. 10.

Figure 10:
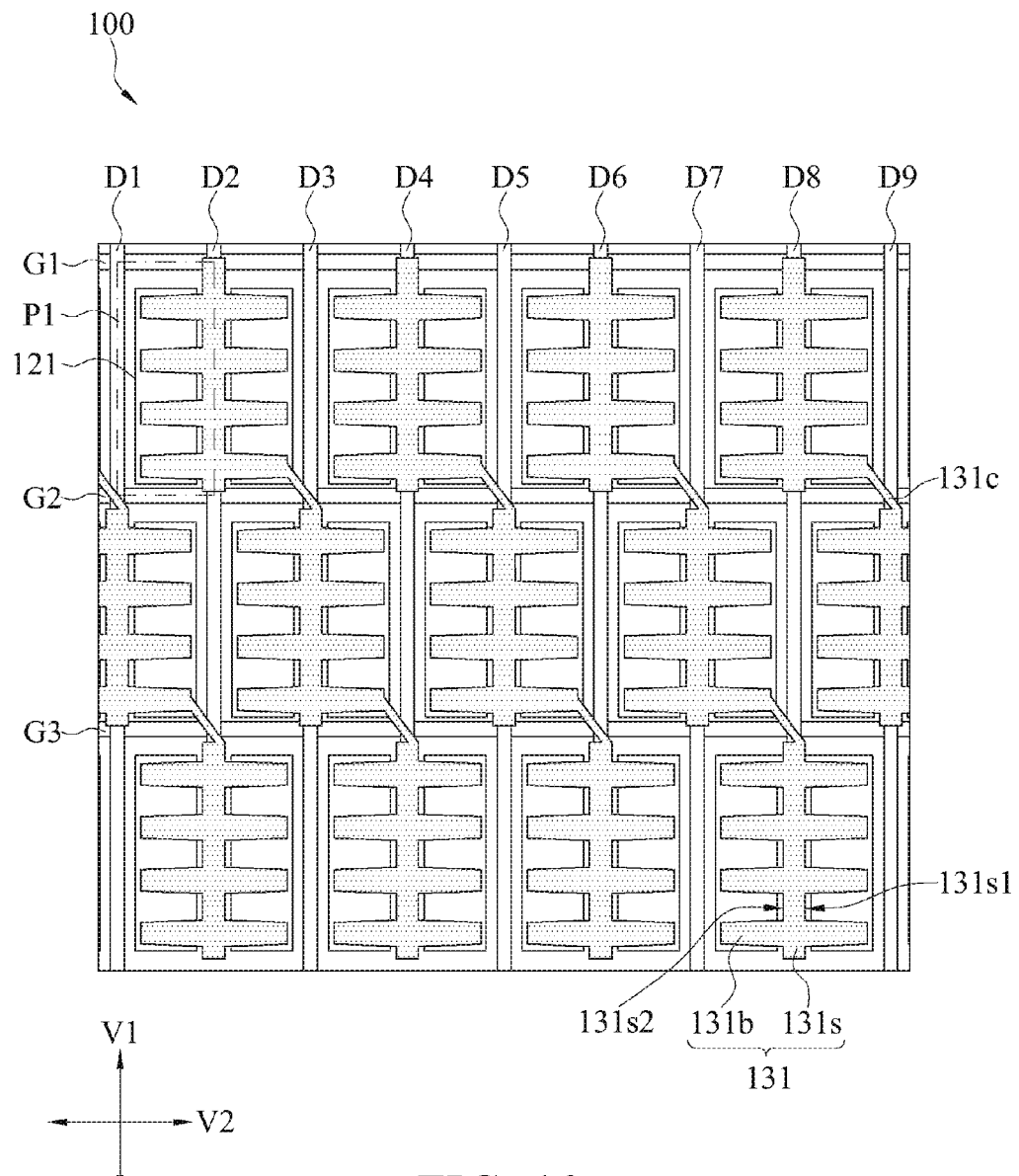
FIG. 10 is a schematic top view of an embodiment in which a stem of each first common electrode and a stem of another adjacent first common electrode in FIG. 2 are arranged in a staggered manner.

In an embodiment, a stem 131s of each first common electrode 131 and a stem 131s of another adjacent first common electrode 131 may be arranged in a staggered manner in the first direction V1, to improve uniformity of displayed colors of the display panel 100, as shown in FIG. 4 or FIG. 10. For example, when color display of each sub-pixel electrode 121 is configured in an arrangement manner of stripe pixels, displayed brightness of sub-pixels in adjacent rows and used to display a same color is complementary. Therefore, the uniformity of displayed colors of the display panel 100 may be improved. When the display panel 100 is configured in a manner in which every four or more sub-pixel electrodes 121 share one first common electrode 131, and stems 131s of the first common electrodes 131 are disposed in a staggered manner, the uniformity of displayed colors of the display panel 100 may further be improved. In addition, in this way, the problem of non-uniform vertical image brightness distribution in terms of the display effect due to sharing one first common electrode 131 by a plurality of sub-pixel electrodes 121 may further be resolved.

Figure 11:
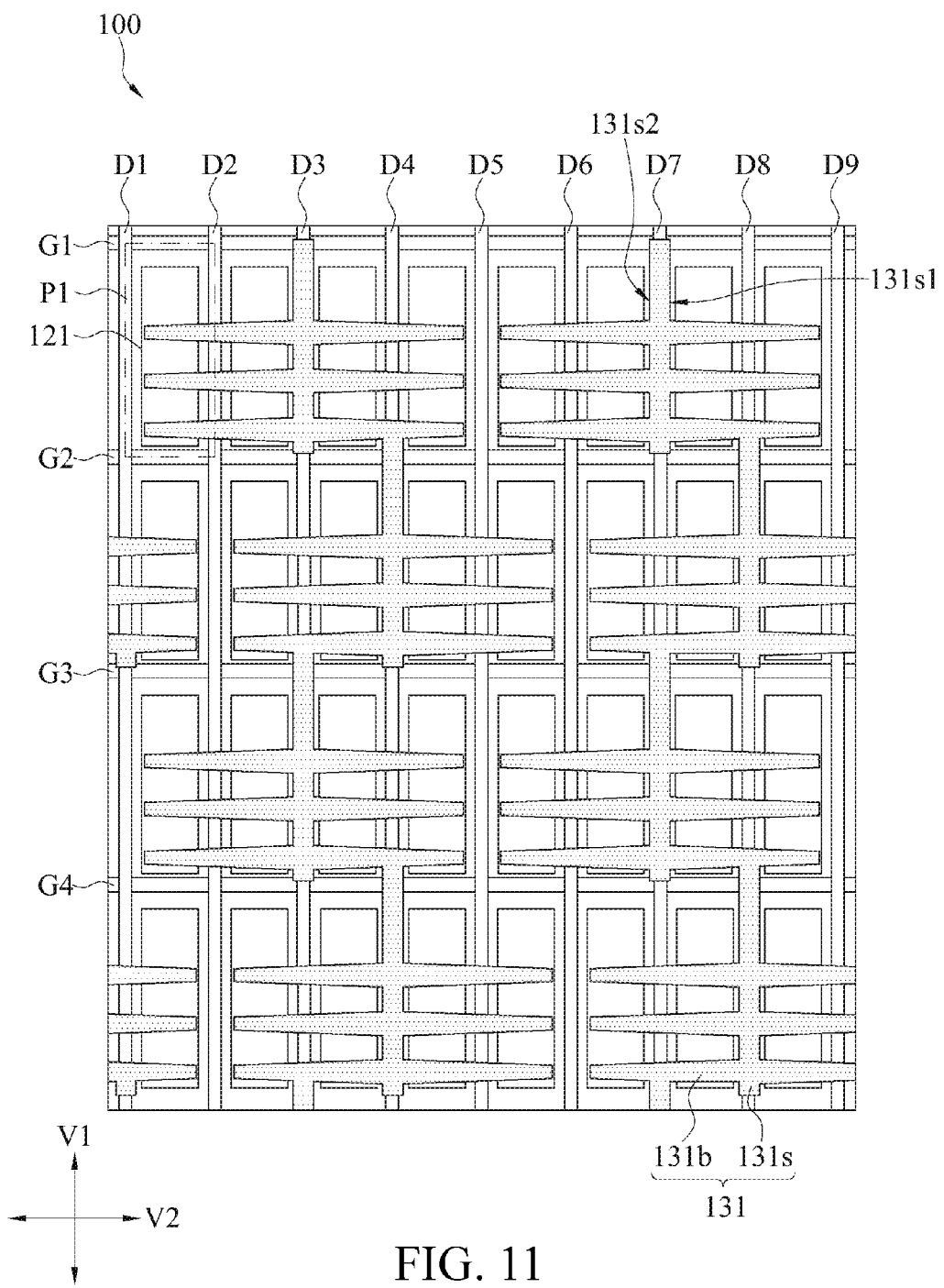
FIG. 11 is a schematic top view of a third embodiment of a display panel.

In an embodiment, the stem 131s of each first common electrode 131 and a stem 131s of an adjacent first common electrode 131 in the first direction V1 may be disposed by performing displacement for at least one sub-pixel electrode 121 in a same direction of the second direction V2, as shown in FIG. 4 or FIG. 10. However, the present invention is not limited thereto. FIG. 11 is a schematic outline top view of a third embodiment of a display panel. In another embodiment, alternatively, the stem 131s of each first common electrode 131 and a stem 131s of an adjacent first common electrode 131 in the first direction V1 may be disposed by performing displacement back and forth for at least one sub-pixel electrode 121 in the second direction V2, as shown in FIG. 11.

Figure 12:
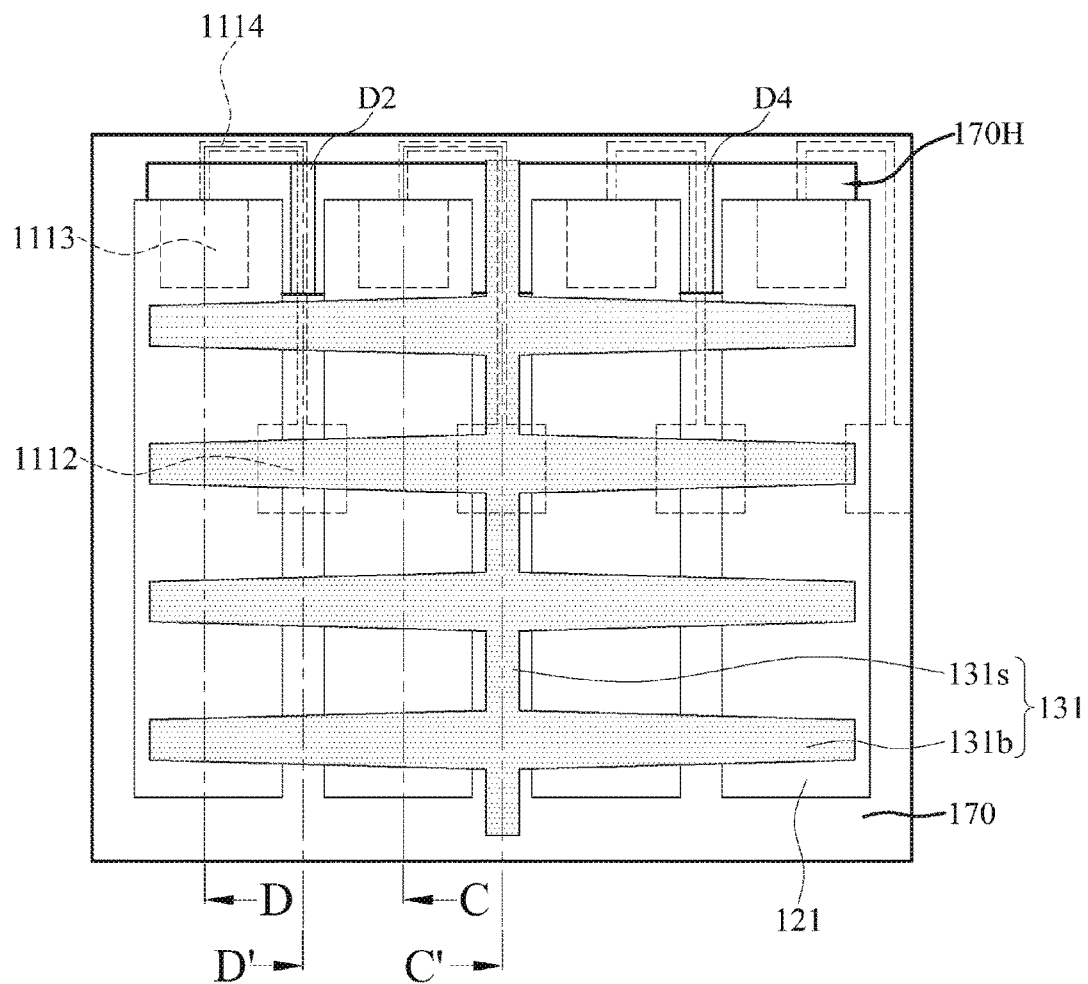
FIG. 12 is a schematic diagram of an embodiment of a first common electrode, a sub-pixel electrode, and a second common electrode layer.
Figure 13:
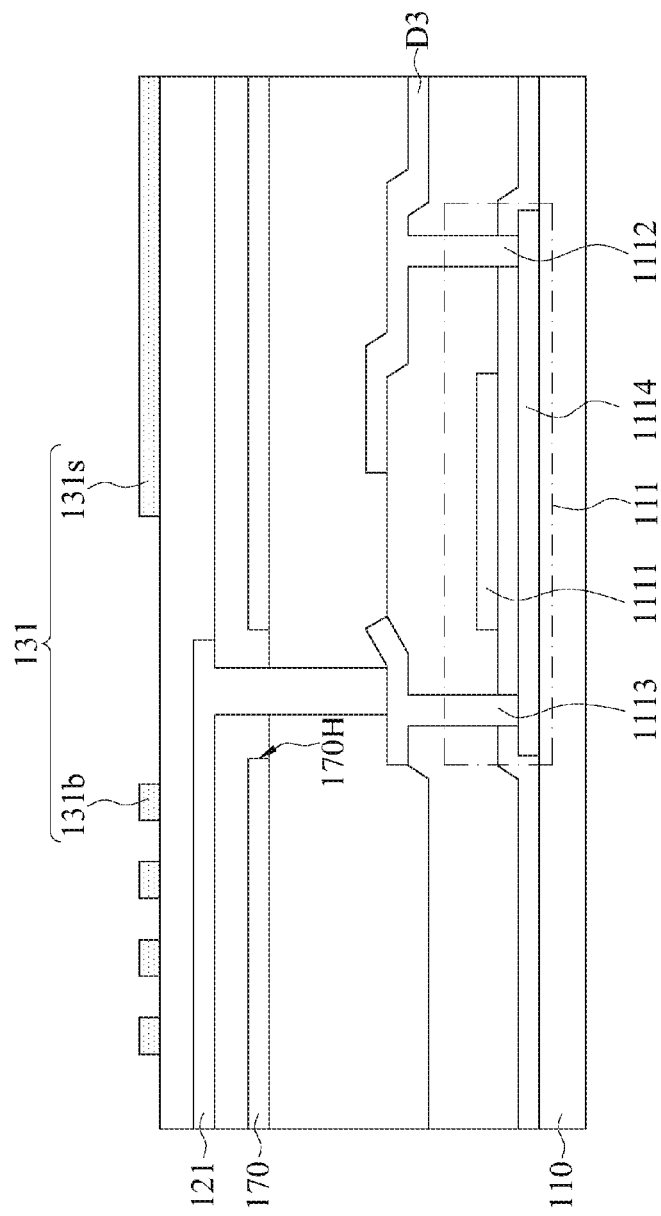
FIG. 13 is a schematic structural cross-sectional view along a section line C-C' in FIG. 12.
Figure 14:
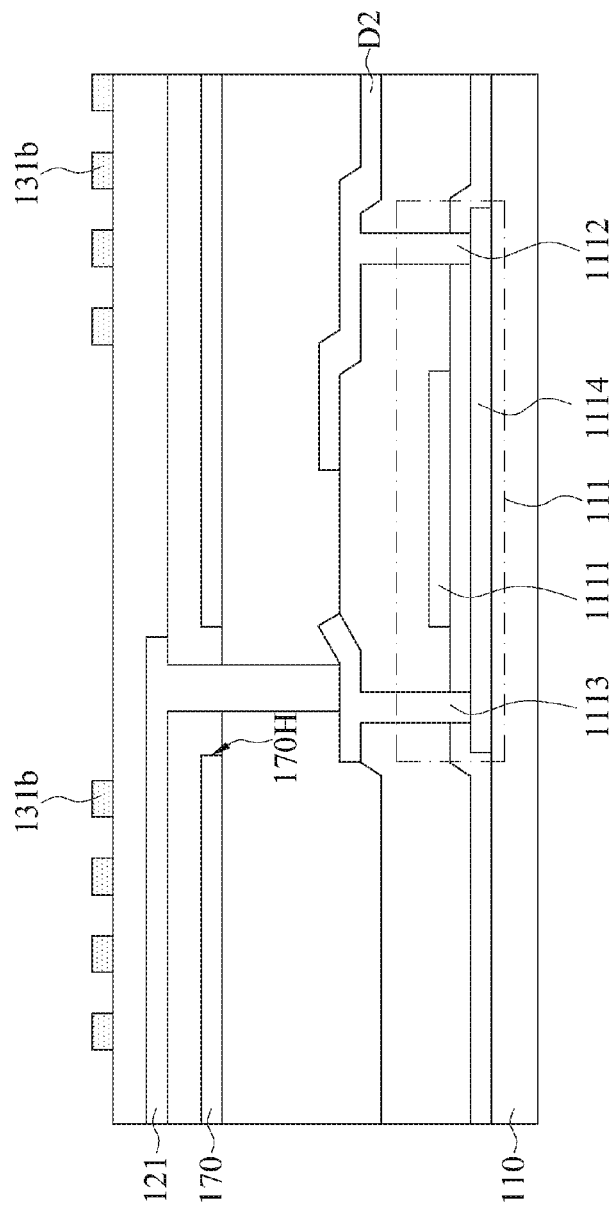
FIG. 14 is a schematic structural cross-sectional view along a section line D-D' in FIG. 12.

FIG. 12 is a schematic outline diagram of an embodiment of a first common electrode, a sub-pixel electrode, and a second common electrode layer. FIG. 13 is a schematic structural cross-sectional view along a section line C-C' in FIG. 12. FIG. 14 is a schematic structural cross-sectional view along a section line D-D' in FIG. 12. Referring to FIG. 12 to FIG. 14, in some embodiments, the display panel 100 may further include a second common electrode layer 170, and the second common electrode layer 170 is located between a plurality of sub-pixel electrodes 121 and a substrate 110.

In some embodiments, the second common electrode layer 170 may include a plurality of openings 170H. Each opening 170H is disposed corresponding to at least one sub-pixel electrode 121, so that the sub-pixel electrode 121 may be electrically connected, through the corresponding opening 170H on the second common electrode layer 170, to an active element 111 located on the substrate 110. In an embodiment, every two sub-pixel electrodes 121 may share one opening 170H. However, the present invention is not limited thereto.

In some embodiments, referring to FIG. 1 and FIG. 3, the display panel 100 may further include an opposite substrate 140, a light shielding pattern layer 150, and a display medium layer 160. The opposite substrate 140 is disposed opposite to a substrate 110. The light shielding pattern layer 150 and the display medium layer 160 are disposed between the substrate 110 and the opposite substrate 140. In addition, the display panel 100 may further include a color filter pattern layer, which may be disposed on the first substrate 110 or the opposite substrate 140. This is not limited in the present invention.

In an embodiment, the light shielding pattern layer 150 may be disposed on the opposite substrate 140. Generally, the light shielding pattern layer 150 may be referred to as a black matrix, and may be used to shield an area not used for display in the display panel 100, for example, positions where first signal lines D1-D9 and second signal lines G1-G3 are disposed. Therefore, the stem 131s of each first common electrode 131 may be shielded under the light shielding pattern layer 150, so that a dark area formed due to the configuration manner of the first common electrode 131 and the sub-pixel electrode 121 may be partially shielded under the light shielding pattern layer 150. Further, the penetration rate of the sub-pixel electrode 121 is improved, and the liquid crystal efficiency of the display panel 100 is also improved.

In some embodiments, the opposite substrate 140 may be a transparent substrate, for example, a glass substrate, a plastic substrate, a quartz substrate, or other proper materials. The material of the light shielding pattern layer 150 may be a black photoresist or a material having low transmittance, for example, a metal having low reflectivity (for example, chromium and nickel).

In some embodiments, the display medium layer 160 may include a liquid crystal material, an organic light-emitting material, ink, electronic ink, or other proper display materials. However, the present invention is not limited thereto.

In conclusion, the display panel in the embodiments of the present invention may be configured in a manner in which a plurality of sub-pixel electrodes shares one first common electrode and an orthogonal projection of a stem of each first common electrode onto the substrate may be located between two adjacent sub-pixels, so that a dark area of the display panel formed due to configuration of the first common electrode and the sub-pixel electrodes may be partially shielded by a light shielding pattern layer subsequently formed in the display panel. Therefore, the penetration rate of each pixel area may be improved, and the liquid crystal efficiency of the display panel may further be improved. In some embodiments, when configuration is performed in a manner in which every four or more pixel electrodes share one first common electrode, and stems of the first common electrodes are disposed in a staggered manner, the phenomenon of non-uniform displayed colors of the display panel may further be obviously improved and the problem of non-uniform vertical image brightness distribution of the display panel may further be obviously resolved.

The technical content of the present invention is disclosed through the foregoing preferred embodiments; however, these embodiments are not intended to limit the present invention. Various changes and modifications made without departing from the spirit and scope of the present invention shall fall within the protection scope of the present invention. The protection scope of the present invention is subject to the appended claims.

What is claimed is:
1. A display panel, comprising:
a substrate;
a plurality of first signal lines, disposed on the substrate and extending along a first direction;
a plurality of second signal lines, disposed on the substrate and extending along a second direction, wherein the second direction is orthogonal to the first direction, and the plurality of first signal lines and the plurality of second signal lines define a plurality of pixel areas together;

a plurality of sub-pixel electrodes, wherein each of the plurality of sub-pixel electrodes is disposed in one of the plurality of pixel areas; and a first common electrode layer, including a plurality of first common electrodes electrically connected to each other, wherein each first common electrode includes a stem and a plurality of branches, and the branches are coupled to two sides of the stem and extend away from the stem;

wherein a first orthogonal projection of the stem onto the substrate is located between two adjacent sub-pixel electrodes, and second orthogonal projections of the branches onto the substrate correspond to at least one sub-pixel electrode; and wherein extension directions of the branches of each first common electrode are parallel to the second direction, the branches of each first common electrode are spaced apart from branches of an adjacent first common electrode in the second direction by a first spacing, and the first spacing is less or equal to a width of the sub-pixel electrode.

2. The display panel according to claim 1, wherein the stem of each first common electrode extends along the first direction and corresponds to one of the first signal lines, and the stems are spaced apart from each other in the second direction by at least two pixel areas.

3. The display panel according to claim 2, wherein each first common electrode coves four sub-pixel electrodes, and the pixel areas of three of the four sub-pixel electrodes are used to display different colors.

4. The display panel according to claim 1, wherein the branches of each first common electrode are spaced apart from each other in the first direction by a second spacing, and the second spacing ranges from 2.5 μm to 8 μm.

5. The display panel according to claim 1, wherein the stem of each first common electrode extends along the first direction and corresponds to one of the first signal lines, and the stem of each first common electrode is connected a first branch of an adjacent first common electrode in the first direction.

6. The display panel according to claim 5, wherein the stems of the first common electrodes adjacent in the first direction are arranged in a staggered manner by performing displacement for one pixel area.

7. The display panel according to claim 5, wherein the stems of the first common electrodes adjacent in the first direction are disposed by sequentially performing displacement for at least one pixel area in the second direction.

8. The display panel according to claim 1, wherein a width of each branch ranges from 0.5 μm to 2.5 μm.

9. The display panel according to claim 1, wherein a width of each branch gradually decreases from a first end coupled to the stem to a second end.

10. The display panel according to claim 1, wherein a width of each branch gradually increases from a first end coupled to the stem to a second end.

11. The display panel according to claim 1, wherein an edge of each branch and a line perpendicular to an edge of the stem are angled from 0 degrees to 45 degrees.

12. The display panel according to claim 1, wherein each first common electrode covers four sub-pixel electrodes.

13. The display panel according to claim 12, wherein extension directions of the branches are parallel to the second direction, the extension lengths of the branches are between a width of one pixel area and a width of two pixel areas.

14. The display panel according to claim 1, further comprising: a second common electrode layer, located between the plurality of sub-pixel electrodes and the substrate.

* * * * *